(12) United States Patent
Choi et al.

(10) Patent No.: US 8,160,171 B2
(45) Date of Patent: Apr. 17, 2012

(54) DTV RECEIVER AND METHOD OF PROCESSING BROADCAST SIGNAL IN DTV RECEIVER

(75) Inventors: In Hwan Choi, Gyeonggi-do (KR); Kook Yeon Kwak, Gyeonggi-do (KR); Byoung Gill Kim, Seoul (KR); Woo Chan Kim, Gyeonggi-do (KR); Jae Hyung Kim, Seoul (KR); Hyoung Gon Lee, Seoul (KR); Jong Moon Kim, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/157,133

(22) Filed: Jun. 9, 2011

(65) Prior Publication Data

US 2011/0234914 A1    Sep. 29, 2011

Related U.S. Application Data

(63) Continuation of application No. 12/970,841, filed on Dec. 16, 2010, now Pat. No. 7,995,669, which is a continuation of application No. 12/852,420, filed on Aug. 6, 2010, now Pat. No. 7,885,347, which is a continuation of application No. 11/615,496, filed on Dec. 22, 2006, now Pat. No. 7,796,712.

(60) Provisional application No. 60/825,269, filed on Sep. 11, 2006.

(30) Foreign Application Priority Data

Dec. 23, 2005 (KR) .................. 10-2005-0128961

(51) Int. Cl.
 *H04L 5/12* (2006.01)
(52) U.S. Cl. ...................................................... 375/265
(58) Field of Classification Search .............. 375/265, 375/341, 350
 See application file for complete search history.

(56) References Cited

U.S. PATENT DOCUMENTS

| | | | |
|---|---|---|---|
| 6,731,700 B1 | 5/2004 | Yakhnich et al. | |
| 6,944,242 B2 | 9/2005 | Yakhnich et al. | |
| 7,730,386 B2 | 6/2010 | Kang et al. | |
| 7,739,574 B2 | 6/2010 | Kang et al. | |
| 7,804,909 B2 | 9/2010 | Choi et al. | |
| 2002/0159520 A1 | 10/2002 | Choi et al. | |
| 2002/0186790 A1 | 12/2002 | Choi et al. | |
| 2009/0310014 A1* | 12/2009 | Kang et al. ................. | 348/423.1 |
| 2010/0271555 A1* | 10/2010 | Choi et al. .................... | 348/720 |

FOREIGN PATENT DOCUMENTS

WO    2005-109878    11/2005

\* cited by examiner

*Primary Examiner* — Don N Vo
(74) *Attorney, Agent, or Firm* — Lee, Hong, Degerman, Kang & Waimey

(57) ABSTRACT

A DTV receiver includes a tuner tuning to a channel to receive a broadcast signal, and a demodulator demodulating the broadcast signal. The receiver further includes a first decoder which decodes main and enhanced data included in the demodulated signal by calculating soft decision values for the enhanced data and hard decision values for the main data. The receiver further includes a second decoder for decoding the main and enhanced data for first forward error correction, and a third decoder for decoding the FEC-decoded enhanced data for second forward error correction.

8 Claims, 5 Drawing Sheets

DTV RECEIVER AND METHOD OF PROCESSING BROADCAST SIGNAL IN DTV RECEIVER

This application is a continuation of U.S. Application Ser. No. 12/970,841, filed on Dec. 16, 2010, now U.S. Pat. No. 7,995,669, which is a continuation of U.S. application Ser. No. 12/852,420, filed on Aug. 6, 2010, now U.S. Pat. No. 7,885,347, which is a continuation of U.S. application Ser. No. 11/615,496, filed on Dec. 22, 2006, now U.S. Pat. No. 7,796,712, which claims the benefit of Korean Patent Application No. 10-2005-0128961, filed on Dec. 23, 2005, and the benefit of U.S. Provisional Application No. 60/825,269, filed on Sep. 11, 2006, which are all hereby incorporated by reference herein in their entireties.

BACKGROUND OF THE INVENTION

1. Field of the Invention

The present invention relates to a digital telecommunications system, and more particularly, to a DTV receiver and a method of processing a broadcast signal in a DTV receiver.

2. Discussion of the Related Art

The Vestigial Side Band (VSB) transmission mode, which is adopted as the standard for digital broadcasting in North America and the Republic of Korea, is a system that has been developed for the transmission of MPEG video/audio data. However, presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the MPEG video/audio data. However, with the advent of digital broadcasting, ATSC VSB digital television receivers that receive only MPEG video/audio data are already supplied to the market. Therefore, the supplemental data that are transmitted through the same channel as the MPEG video/audio data should not influence the conventional ATSC VSB receivers that are provided in the market. In other words, this may be defined as ATSC VSB compatibility, and the supplemental data broadcast system should be compatible with the ATSC VSB system. Herein, the supplemental data may also be referred to as enhanced data. Furthermore, in a poor channel environment, the receiving performance of the conventional ATSC VSB receiving system may be deteriorated. More specifically, resistance to changes in channels and noise is more highly required when using portable and/or mobile receivers.

SUMMARY OF THE INVENTION

Accordingly, the present invention is directed to a DTV receiver and a method of processing a broadcast signal in a DTV receiver that substantially obviates one or more problems due to limitations and disadvantages of the related art.

An object of the present invention is to provide to a DTV receiver and a method of processing a broadcast signal in a DTV receiver that can perform a soft decision on a set of received enhanced data so as to perform additional error correction decoding.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) receiver includes a tuner, a demodulator, a soft-in-soft-out (SISO) decoder, a first forward-error-correction (FEC) decoder, and a second FEC decoder. The tuner initially tunes to a channel to receive a broadcast signal. The demodulator then demodulates the broadcast signal. The SISO decoder decodes main and enhanced data included in the demodulated signal by calculating soft decision values for the enhanced data and hard decision values for the main data. For example, the soft decision values may be obtained by calculating log-likelihood-ratio (LLR) values for the enhanced data. The first FEC decoder decodes the SISO-decoded main and enhanced data for first FEC, and the second FEC decoder decodes the FEC-decoded enhanced data for second FEC.

The DTV receiver according to the present invention further includes a derandomizer which derandomizes the main and enhanced data decoded by the first FEC decoder. It bypasses or inverts each soft decision value based on a value of a corresponding pseudo random bit. For example, bypasses a soft decision value if a value of a corresponding random bit is 0, and it inverts the soft decision value if the random bit value is 1. The derandomizer performs an exclusive OR (XOR) operation on the hard decision values for the main data with their corresponding pseudo random bits, respectively. On the other hand, it obtains hard decision values of the soft decision values for the enhanced data and performs an exclusive OR (XOR) operation on the hard decision values and their corresponding pseudo random bits, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, weather information, and so on, or consist of video/audio data. Additionally, the known data refer to data already known based upon a pre-determined agreement between the transmitter and the receiver. Furthermore, the main data consist of data that can be received from the conventional receiving system, wherein the main data include video/audio data. The present invention relates to outputting a soft decision value corresponding to a set of received enhanced data, thereby enhancing the performance of additional error correction decoding on the enhanced data.

Figure 1:
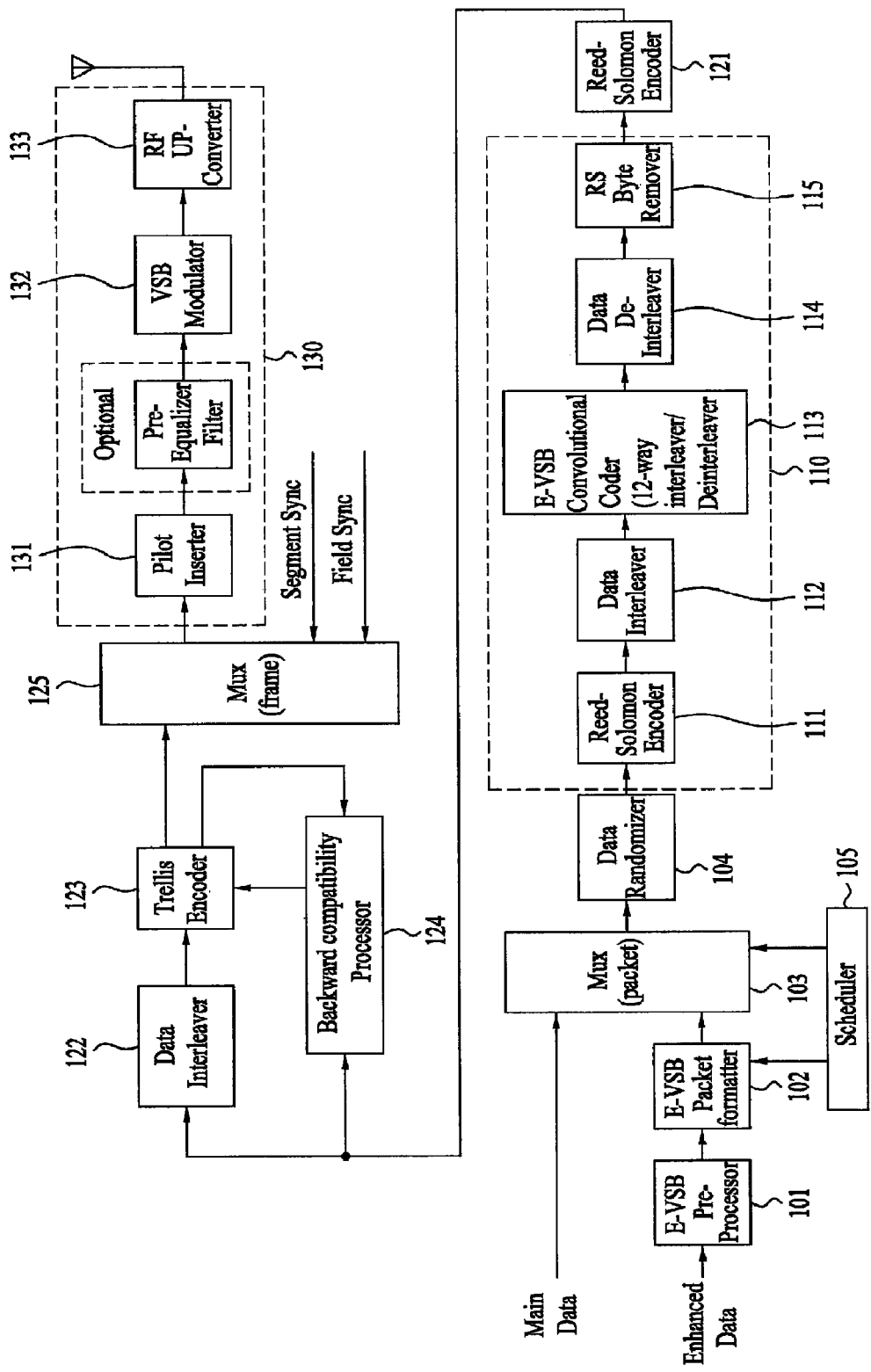
FIG. 1 illustrates a block diagram of a digital broadcast transmitting system according to an embodiment of the present invention.
Figure 2:
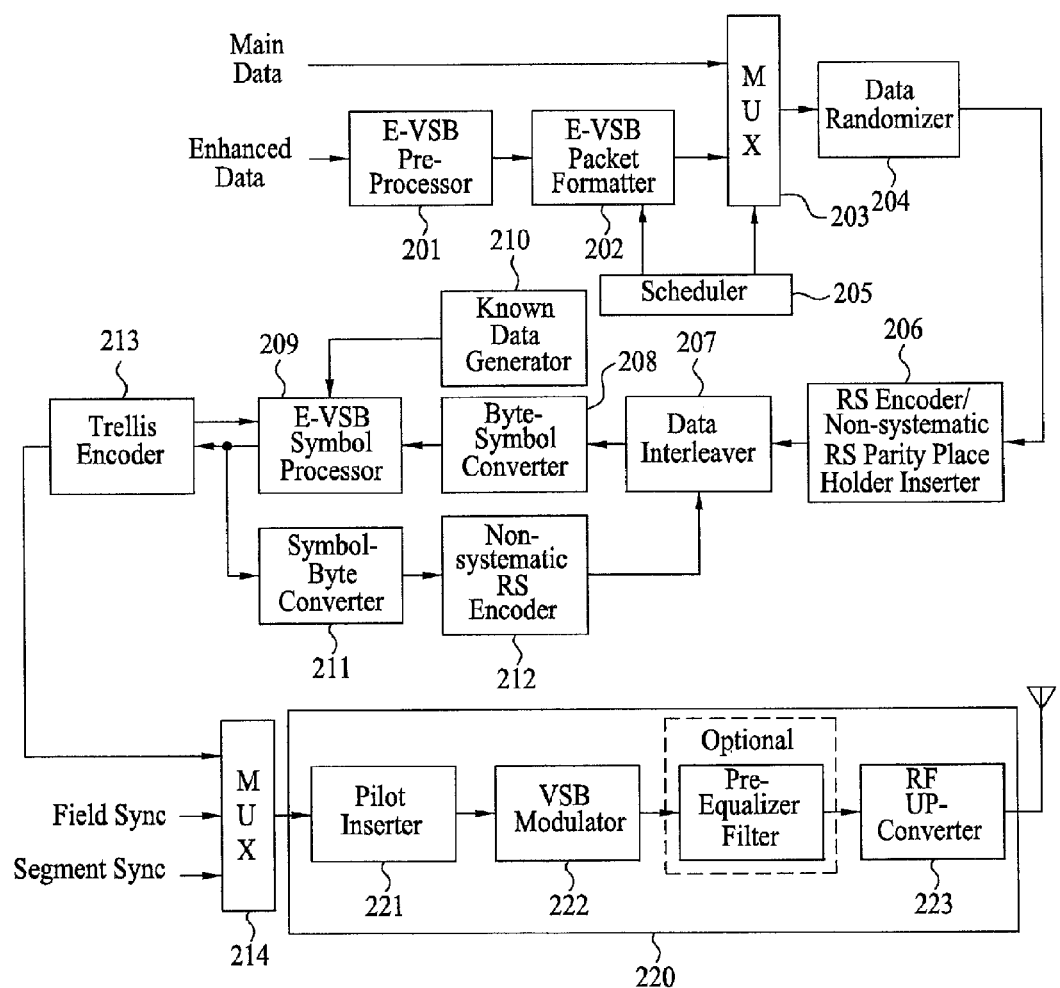
FIG. 2 illustrates a block diagram of a digital broadcast transmitting system according to another embodiment of the present invention.

FIG. 1 and FIG. 2 illustrate block diagrams of a digital television (or broadcast) transmitting system for transmitting enhanced data according to preferred embodiments of the present invention. FIG. 1 and FIG. 2 illustrate examples of a digital broadcast transmitting system for multiplexing and transmitting enhanced data and known data. In the present invention, any type of digital broadcast transmitting system for transmitting enhanced data may be applied herein, and therefore, the digital broadcast transmitting system is not limited to the examples set forth in the description of the present invention.

FIG. 1 illustrates a digital broadcast transmitting system according to an embodiment of the present invention. The digital broadcast transmitting system includes an E-VSB pre-processor 101, an E-VSB packet formatter 102, a packet multiplexer 103, a data randomizer 104, a scheduler 105, an E-VSB post-processor 110, a Reed-Solomon (RS) encoder 121, a data interleaves 122, a trellis encoder 123, a backward compatibility processor 124, a frame multiplexer 125, and a transmitter 130.

In the digital broadcast transmitting system having the structure shown in FIG. 1, main data are outputted to the packet multiplexer 103 in transport packet units, and enhanced data are outputted to the E-VSB pre-processor 101. The E-VSB pre-processor 101 pre-processes the enhanced data, such as encoding additional error correction, interleaving, and inserting null data, and then outputs the pre-processed enhanced data to the E-VSB packet formatter 102.

Based upon the control of the scheduler 105, the E-VSB packet formatter 102 multiplexes the pre-processed enhanced data and pre-defined known data (or a known data place holder), thereby configuring a group. The data within the group are then divided into 184-byte unit enhanced data packets, and a 4-byte MPEG header is added to the beginning of the enhanced data packet, thereby outputting a 188-byte enhanced data packet (i.e., a MPEG compatibility packet). More specifically, one enhanced data packet group includes a plurality of consecutive enhanced data packets.

The output of the E-VSE packet formatter 102 is inputted to the packet multiplexer 103. The packet multiplexer 103 time-division multiplexes the main data packet and the enhanced data packet group in transport stream (TS) packet units and outputs the multiplexed TS packet in accordance with the control of the scheduler 105. More specifically, the scheduler 105 generates and outputs a control signal so that the packet formatter 102 can multiplex the main data packet and the enhanced data packet group. Accordingly, the packet multiplexer 103 receives the control signal, thereby multiplexing and outputting the main data packet and the enhanced data packet group to TS packet units. As an example of the present invention, the process of the known data and enhanced data being multiplexed in the E-VSB packet formatter 102 is described herein.

Meanwhile, the output of the packet multiplexer 103 is randomized by the data randomizer and then provided to the E-VSB post-processor 110. The E-VSB post-processor 110 includes a RS encoder 111, a data interleaver 112, an E-VSB convolutional encoder 113, a data deinterleaver 114, and a RS byte remover 115. Herein, the RS encoder 111 RS-codes the output of the data randomizer 104 so as to add 20-byte parity data thereto. Thereafter, the processed data pass though the data interleaver 112 and are then provided to the E-VSB convolutional encoder 113.

The E-VSB convolutional encoder 113 converts the data bytes inputted thereto to symbols, so as perform convolution-coding on only the enhanced data symbols. Thereafter, the E-VSB convolutional encoder 113 converts the symbols back to bytes, which are then outputted. More specifically, when the output of the data interleaver 112 corresponds to the main data or to the known data inserted in the enhanced data packet, the E-VSB convolutional encoder 113 outputs the data without any modification. Furthermore, the E-VSB convolutional encoder 113 also outputs the MPEG header byte added by the E-VSB packet formatter 102 or the RS parity byte added to the enhanced data packet by the RS encoder 111 without any data modification. The output of the E-VSB convolutional encoder 113 is deinterleaved by the data deinterleaver 114 and is then outputted to the RS byte remover 115 so as to have 20 bytes of parity data removed therefrom. This process is necessary for recalculating the parity since the initial data have been modified (or changed) by the E-VSB convolutional encoder 113. The output of the RS byte remover 115 is provided to the RS encoder 121.

The RS encoder 121 performs an RS-coding process identical to that of the conventional ATSC VSB system on the input data, thereby adding 20 bytes of parity bytes at the end of the 187-byte data. Thereafter, the processed data re outputted to the data interleaver 122 and the backward compatibility processor 124. The data interleaver 122 performed an interleaving process of the input data. Herein, the same interleaving rules as those of the data interleaver 112 are applied. The output of the data interleaver 122 is inputted to the trellis encoder 123. Thereafter, the trellis encoder 123 codes the inputted 2 bits to 3 bits, which are then outputted. The output of the trellis encoder 123 is inputted to the frame multiplexer 125. Then, the frame multiplexer 125 inserts a field synchronization signal and a segment synchronization signal in the output of the trellis encoder 123, and the processed data are outputted to the transmitter 130. The transmitter 130 includes a pilot inserter 131, a VSB modulator 132, and a radio frequency (RF) converter 133. Since the role and operation of the transmitter 130 are identical to those of the transmitter in the conventional VSB transmitting system, a detailed description of the same will be omitted for simplicity.

Meanwhile, in order to determine the output data of the trellis encoder 123 as the enhanced data defined by the transmitting and receiving systems, the memory within the trellis encoder 123 corresponding to the known data inserted in the enhanced data packet is first required to be initialized. In order to perform such initialization, the input of the trellis encoder 123 needs to be replaced. Therefore, the RS parity is recalculated in accordance with the replacement data so as to replace the initial (or original) parity data. This process is performed by the backward compatibility processor 124.

FIG. 2 illustrates a digital broadcast transmitting system according to another embodiment of the present invention. The digital broadcast transmitting system includes an E-VSB pre-processor 201, an E-VSB packet formatter 202, a packet multiplexer 203, a data randomizer 204, a scheduler 205, a Reed-Solomon encoder/parity place holder inserter 206, data interleaver 207, a byte-symbol converter 208, an E-VSB symbol processor 209, a known data generator 210, a symbol-byte converter 211, a non-systematic RS encoder 212, a trellis encoder 213, a frame multiplexer 214, and transmitter 220. As shown in FIG. 2, in the digital broadcast transmitting system having the above-described structure, a main data packet is outputted to the packet multiplexer 203, and enhanced data are outputted to the E-VSB pre-processor 201. The E-VSB pre-processor 201 pre-processes the enhanced data, such as encoding additional error correction, interleaving, and inserting null data, and then outputs the pre-processed enhanced data to the E-VSB packet formatter 202.

Based upon the control of the scheduler 205, the E-VSB packet formatter 202 multiplexes the pre-processed enhanced data and the known data place holder having the null data inserted therein, thereby configuring a group. The data within the group are then divided into 184-byte unit enhanced data packets, and a 4-byte MPEG header is added to the beginning of the enhanced data packet, thereby outputting a 188-byte enhanced data packet (i.e., a MPEG compatibility packet).

The output of the E-VSB packet formatter 202 is inputted to the packet multiplexer 203. The packet multiplexer 203 time-division multiplexes the main data packet and the enhanced data packet group in transport stream (TS) packet units and outputs the multiplexed TS packet in accordance with the control of the scheduler 205. More specifically, the scheduler 205 generates and outputs a control signal so that the packet formatter 202 can multiplex the main data packet and the enhanced data packet group. Accordingly, the packet multiplexer 203 receives the control signal, thereby multiplexing and outputting the main data packet and the enhanced data packet group to TS packet units.

The output data of the packet multiplexer 203 are inputted to the data randomizer 204. The data randomizer 204 discards (or deletes) the MPEG synchronization byte and randomizes the remaining 187 bytes by using a pseudo-random byte, which is generated from inside the data randomizer 204. Thereafter, the randomized data are outputted to the Reed-Solomon (RS) encoder/parity place holder inserter 206. When the randomized data correspond to the main data packet, the RS encoder/parity place holder inserter 206 RS-codes the randomized data. Alternatively, when the randomized data correspond to the enhanced data packet, the RS encoder/parity place holder inserter 206 performs non-systematic RS parity place holder insertion.

The output data of the RS encoder/parity place holder inserter 206 are outputted to the data interleaver 207. Then, the data interleaver 207 interleaves and outputs the received data. At this point, the data interleaver 207 receives a RS parity byte that is newly calculated and outputted by the non-systematic RS encoder 212 and, then, outputs the newly received RS parity byte instead of the non-systematic RS parity place holder, which is not yet outputted. Each byte outputted from the data interleaver 207 is converted into 4 symbols by the byte-symbol converter 208, which are then inputted to the E-VSB symbol processor 209. Herein, one symbol consists of 2 bits. Additionally, the known data generated (or created) from the known data generator 210 are also inputted to the E-VSB symbol processor 209. Herein, the known data consist of the known data symbol generated from the symbol domain. This is because the known data are used in the symbol domain of the receiver. Also, in the transmitter, it is more efficient to create a known data symbol sequence having the characteristics desired (or required) by the symbol domain.

Meanwhile, when the input data inputted to the E-VSB symbol processor 209 correspond to the known data place holder that is converted to a symbol by the byte-symbol converter 208, the E-VSB symbol processor 209 uses the known data generated from the known data generator 210 instead of the known data place holder. The E-VSB symbol processor 209 then generates a data symbol at the beginning of the known data sequence so that the memory of the trellis encoder 213 is initialized to a pre-decided state. In order to do so, the memory value within the trellis encoder 213 should be inputted to the E-VSB symbol processor 209.

Further, the memory value of the trellis encoder 213 may also be used in an additional signaling process for the enhanced data symbol. Additionally, the trellis encoder 213 is initialized at the beginning of the known data sequence because a plurality of output sequences may be generated depending upon the memory state of the trellis encoder 213 even when the known data sequence is inputted to the trellis encoder 213. Accordingly, the memory state of the trellis encoder 213 is first initialized to a pre-decided value and, then, when the known data are inputted, a desired known data output sequence may be obtained from the output of the trellis encoder 213. The output symbol of the E-VSB symbol processor 209 is inputted to the trellis encoder 213 so as to be trellis-encoded and outputted to the frame multiplexer 214.

Meanwhile, the E-VSB symbol processor 209 receives the 2-bit symbol, processes the received symbol with a plurality of process steps, and outputs the processed symbol. Therefore, the symbol should be converted back to bytes from the symbol-byte converter 211 so that the non-systematic RS encoder 212 can recalculate the RS parity from the output of the E-VSB symbol processor 209. In other words, the input symbol is converted to byte units from the symbol-byte converter 211 and outputted to the non-systematic RS encoder 212. The non-systematic RS encoder 212 calculates the 20-byte RS parity for the data packet configured of 187 information bytes and outputs the calculated RS parity to the data interleaver 207. The data interleaver 207 receives the RS parity byte calculated and outputted from the non-systematic RS encoder 212 and replaces the non-systematic place holder that is not yet outputted with the received RS parity byte.

Herein, since the enhanced data symbol and the known data place holder are changed to different values by the E-VSB symbol processor 209, a decoding error occurs when performing a RS decoding process in the conventional ATSC VSB receiver. The non-systematic RS coding process is performed in order to prevent such decoding error from occurring. The frame multiplexer 214 inserts 4 segment synchronization symbols in each of the 828 output symbols of the trellis encoder 213, thereby configuring a data segment having 832 data symbols. More specifically, one field synchronization segment is inserted in each of the 312 data segments, so as to configure one data field, which is then outputted to the transmitter 220. The transmitter 220 inserts a pilot signal in the output of the frame multiplexer 214, the output having a segment synchronization signal and a field synchronization signal inserted therein. The transmitter 220 then VSB modulates the pilot signal inserted data and converts the VSB modulated data to an RF signal, which is transmitted through the antenna. Accordingly, the transmitter 220 includes a pilot inserter 221, a VSB modulator 222, and a RF-UP converter 223. Furthermore, a pre-equalizer filter may be optionally included.

Figure 3:
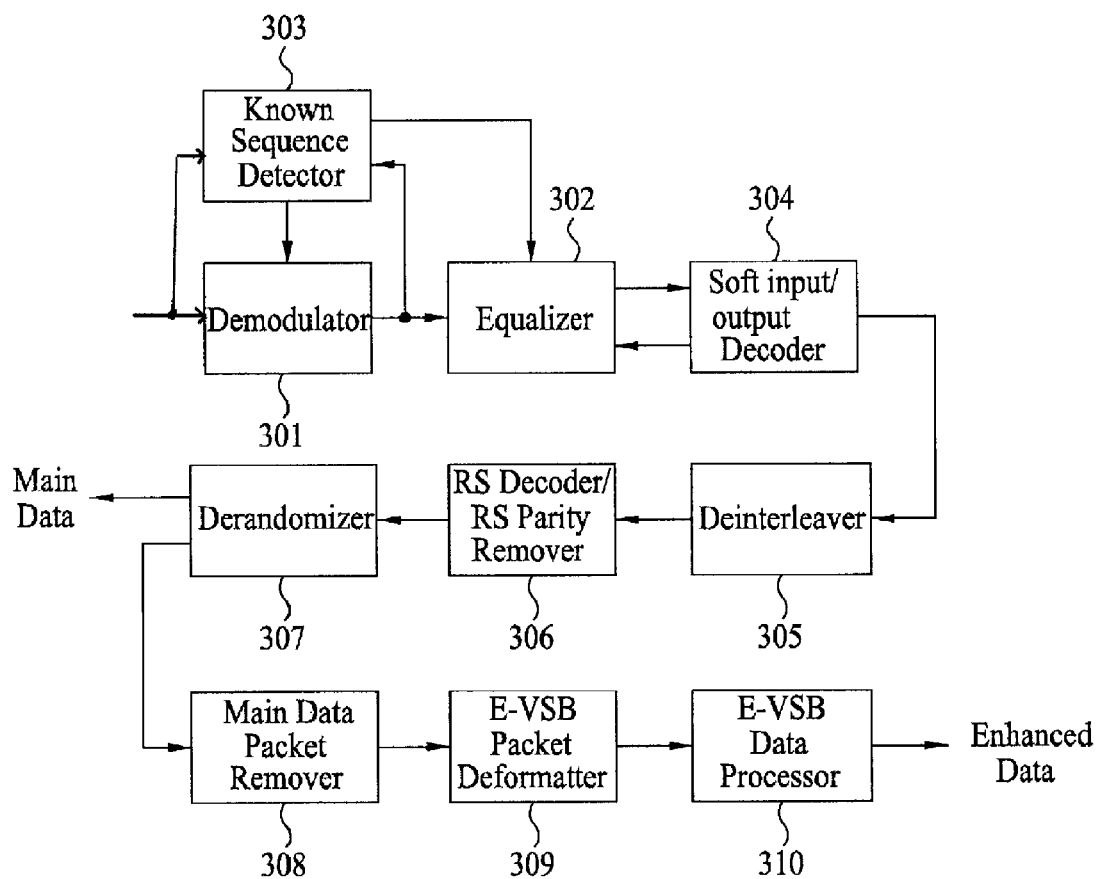
FIG. 3 illustrates a block diagram showing a general structure of a demodulating unit within a receiving system according to an embodiment of the present invention.

FIG. 3 illustrates a block diagram showing the structure of a demodulating unit within a digital broadcast receiving system that receives and processes enhanced data and known data that are multiplexed and transmitted. The demodulating unit may be applied to digital broadcast transmitting system shown in both FIG. 1 and FIG. 2. Furthermore, since any type of demodulating unit that can demodulate enhanced data may be applied to the present invention, the present invention is not limited to the examples set forth herein. In other words, the demodulating unit shown in FIG. 3 is merely an example introduced for a better understanding of the present invention.

The demodulating unit uses the known data information inserted in an enhanced data section and transmitted by the transmitting system, so as to restore the carrier wave synchronization, restore the frame synchronization, and perform channel equalization, thereby enhancing the receiving performance of the present invention.

Referring to FIG. 3, the demodulating unit includes a demodulator 301, an equalizer 302, a known data (or sequence) detector 303, a soft-in-soft-out (SISO) decoder 304, a data deinterleaver 305, a RS decoder/non-systematic RS parity remover 306, and a derandomizer 307. The digital broadcast receiving system further includes a main data packet remover 308, an E-VSB packet deformatter 309, and an E-VSB data processor 310.

More specifically, the received data through a tuner inputs to the demodulator 301 and the known data detector 303. The demodulator 301 demodulates the tuned channel frequency so as to perform carrier recovery and timing recovery, thereby generating a baseband signal. Then, the demodulator 301 outputs the generated baseband signal to the equalizer 302 and the known data detector 303. The equalizer 302 compensates for any channel distortion included in the demodulated signal. Thereafter, the equalizer 302 outputs the processed signal to the SISO decoder 304.

At this point, the known data detector 303 detects the known data symbol sequence inserted from the transmitting system from the input/output data of the demodulator 301 (i.e., the data prior to demodulation or the data after demodulation). Then, the known data detector 303 outputs the detected sequence to the demodulator 301 and the equalizer 302. When the demodulator 301 uses the known data symbol sequence during the timing recovery or the carrier recovery, the demodulating performance may be enhanced. Similarly, when the equalizer 302 uses the known data symbol sequence, the equalization performance may be enhanced.

The SISO decoder 304 receives the output of the equalizer 302 and performs SISO decoding on the received data, which are then outputted to the deinterleaver 305. The SISO decoder 304 feeds-back the SISO decoded result to the equalizer 302 so as to enhance the equalizing performance. Hereinafter, the soft output and soft input error correction decoding operation of the SISO decoder 304 will now be described in detail.

More specifically, in order to enhance the performance of the additional error correction decoding performed on the enhanced data by the E-VSB data processor 310, the SISO decoder 304 outputs a soft decision value on the enhanced data. Accordingly, the E-VSB data processor 310 receives such soft decision value so as to perform the additional error correction decoding process. In other words, the E-VSB data processor 310 performs the additional error correction decoding process on the soft-decided enhanced data. A Reed-Solomon (RS) decoder, a low density parity check code (LDPC) decoder or a turbo decoder may be used as the error correction decoder.

Meanwhile, the E-VSB convolutional encoder 113 of FIG. 1 and the E-VSB symbol processor 209 of FIG. 2 perform encoding at a ½ coding rate (i.e., ½-rate coding) on the enhanced data in the symbol domain. Herein, a convolutional encoder may be used for the ½-rate coding. Therefore, the SISO decoder 304 considers the ½-rate encoder and the trellis encoder as a single encoder, thereby performing a SISO decoding process on the enhanced data. More specifically, in the E-VSB receiving system, concatenated encoding, in which a plurality of error correction codes are used, is performed on the enhanced data. At this point, the error correction encoder of the E-VSB pre-processor may be used as an external encoder, and the E-VSB convolutional encoder (or the E-VSB symbol processor) and the trellis encoder may be used as an internal encoder.

Therefore, in the digital broadcast receiving system, in order to maximize the coding performance of the external code when decoding such concatenated codes, a soft decision value should be outputted from the decoder of the internal code. For this reason, it is preferable that the SISO decoder 304 outputs a soft decision value of the enhanced data and not a hard decision value. The algorithm for outputting the soft decision value on the convolution-coded enhanced data includes a soft output Viterbi algorithm (SOVA) and a maximum a posteriori (MAP) algorithm. Herein, in light of symbol errors, the MAP algorithm has a better performance. However, the MAP algorithm is disadvantageous in that an optimum MAP algorithm requires probabilities (or likelihood) to be calculated in an exponential domain and noise dispersion within channels to be estimated. Among many MAP algorithms, a suboptimum soft output algorithm (SSA) shows the least decrease in performance, calculates probabilities (or likelihood) in a log domain, and does not require any estimation of noise dispersion.

In the digital broadcast transmitting system shown in FIG. 1 and FIG. 2, a ½-rate coding process is performed on 1-bit units of the enhanced data through the ½-rate encoder of the E-VSB convolutional encoder (or the E-VSB symbol processor). The ½-rate coded data are then trellis-encoded by the trellis encoder at a coding rate of ⅔. In other words, a coding process is performed at a coding rate of ⅓ on the enhanced data. A 1-bit unit of the enhanced data is encoded to 3 bits, thereby being transmitted as an 8-level VSB symbol. More specifically, the enhanced data coded to 3-bit units are mapped as a VSB symbol among −7, −5, −3, −1, +1, +3, +5, and +7.

The SISO decoder 304 considers the ½-rate encoder and the trellis encoder as a single encoder, thereby performing a decoding process so as to output a log likelihood ratio (LLR), as shown in Equation 1 below, as the soft decision value.

$$LLR = \text{Log}\frac{Pr(d_k = 1/\text{observation})}{Pr(d_k = 0/\text{observation})} \qquad \text{Equation 1}$$

Herein, observation represents an input sequence of the SISO decoder 304, and the numerator and the denominator may be inversed and defined. Also, $d_k$ indicates an input of the ½-rate encoder, and LLR represents a log value of a ratio between a value of the likelihood of $d_k$ being 1 and a value of the likelihood of $d_k$ being 0. For example, when the likelihood of $d_k$ being 1 is 0.7, and when the likelihood of $d_k$ being 0 is 0.3, the LLR value is equal to Log(0.7/0.3). More specifically, in Equation 1, if the LLR value corresponds to a positive number, this indicates that the likelihood (or probability) of the current decoded enhanced data being equal to '1' is high. Conversely, if the LLR value corresponds to a negative number, this indicates that the likelihood (or probability) of the current decoded enhanced data being equal to '0' is high.

The SISO decoder 304 outputs a soft decision value with respect to the enhanced data symbol. On the other hand, the SISO decoder 304 outputs a hard decision value by using a trellis decoding algorithm, such as a general Viterbi decoder, with respect to the main data symbol and the known data symbol. Furthermore, the E-VSB symbol processor considers the RS parity byte and the MPEG header byte, which have been added to the enhanced data packet by the transmitting system, as a main data symbol and, therefore, does not perform coding at a ½ coding rate. For this reason, the SISO decoder 304 outputs a hard decision value by using a trellis decoding algorithm, such as a general Viterbi decoder.

The deinterleaver 305 performs a deinterleaving process, which corresponds to the inverse operation of the data interleaver of the transmitting system, on the output of the SISO decoder 304 and then outputs the processed data to the RS decoder/non-systematic RS parity remover 306. If the received data corresponds to the main data packet, the RS decoder/non-systematic RS parity remover 306 RS-decodes the received data. Alternatively, if the received data corresponds to the enhanced data packet, the RS decoder/non-systematic RS parity remover 306 removes the non-systematic RS parity byte from the received data. Thereafter, the processed data are outputted to the derandomizer 307.

The derandomizer 307 receives the output of the RS decoder/non-systematic RS parity remover 306 and generates a pseudo random data byte identical to that of the randomizer included in the transmitting system. Thereafter, the derandomizer 307 performs a bitwise exclusive OR (XOR) operation on the generated pseudo random data byte, thereby inserting the MPEG synchronization bytes to the beginning of each packet so as to output the data in 188-byte main data packet units. The output data of the derandomizer 307 are outputted to the main MPEG decoder (not shown) and also outputted to the main data packet remover 308 at the same time.

However, it is difficult to perform a bitwise exclusive OR (XOR) operation between the soft decision value of the enhanced data bit and the pseudo random bit. Accordingly, as described above, a hard decision is performed on the data outputted to the main MPEG decoder in accordance with the soft decision value of the coder. Thereafter, a XOR operation is performed between the hard decided output data and the pseudo random bit. More specifically, when the soft decision value is a positive number, the output data are decided as '1', and when the soft decision value is a negative number, the output data are decided as '0'. And, a XOR operation is performed between such decision value and the pseudo random bit.

In the E-VSB data processor 310 of FIG. 3, a soft decision is needed in order to enhance the performance when decoding the error correction code. Therefore, the derandomizer 307 creates a separate output with respect to the enhanced data and outputs the newly created output to the main data packet remover 308. For example, when an XOR operation is performed between the pseudo random bit and the soft decision value of the enhanced data bit, and when the pseudo random bit is equal to '1', the derandomizer 307 changes the code of the soft decision value and then outputs the changed code. On the other hand, if the pseudo random bit is equal to '0', the derandomizer 307 outputs the soft decision value without any change in the code.

If the pseudo random bit is equal to '1' as described above, the code of the soft decision value is changed because, when an XOR operation is performed between the pseudo random bit and the input data in the randomizer of the transmitter, and when the pseudo random bit is equal to '1', the code of the output data bit becomes the opposite of the input data (i.e., 0 XOR 1=1 and 1 XOR 0=0). More specifically, if the pseudo random bit generated from the derandomizer 307 is equal to '1', and when an XOR operation is performed on the hard decision value of the enhanced data bit, the XOR-operated value becomes the opposite value of the hard decision value. Therefore, when the soft decision value is outputted, a code opposite to that of the soft decision value is outputted.

The main data packet remover 308 only obtains and outputs the soft decision value of the enhanced data packet from the output of the derandomizer 307. More specifically, the main data packet remover 308 removes the 188-byte unit main data packet from the output of the derandomizer 307. Then, the main data packet remover 308 only obtains the soft decision value of the enhanced data packet and outputs the obtained value to the E-VSB packet deformatter 309.

The E-VSB packet deformatter 309 removes the MPEG header from the output data so as to obtain a 184-byte packet. Herein, the MPEG header has a PID for the enhanced data, which have been inserted by the transmitting system so as to be differentiated from the main data packet. Such 184-byte data packets are grouped to form a group having a predetermined size. Thereafter, the known data that have been inserted for the demodulation and equalization by the transmitting system are removed from a predetermined place (or position). The output of the E-VSB packet formatter 309 is inputted to the E-VSB data processor 310.

The E-VSB data processor 310 performs deinterleaving and decoding of the error correction code with respect to the enhanced data that are soft-decided and outputted. In other words, the E-VSB data processor 310 performs an inverse operation of the E-VSB pre-processor of the transmitting system. In the E-VSB pre-processor of the E-VSB transmitting system, additional error correction coding, interleaving, and byte expansion processes are performed on the enhanced data. Herein, the byte expansion process is performed by inserting null bits or by repeating input bits. Therefore, the E-VSB data processor 310 removes the null bits or the repetition bits, which have been inserted by the E-VSB proprocessor for the byte expansion process, from the soft-decided enhanced data. Thereafter, a deinterleaving process and a error correction code decoding process are performed so as to output the finally processed enhanced data.

Figure 4:
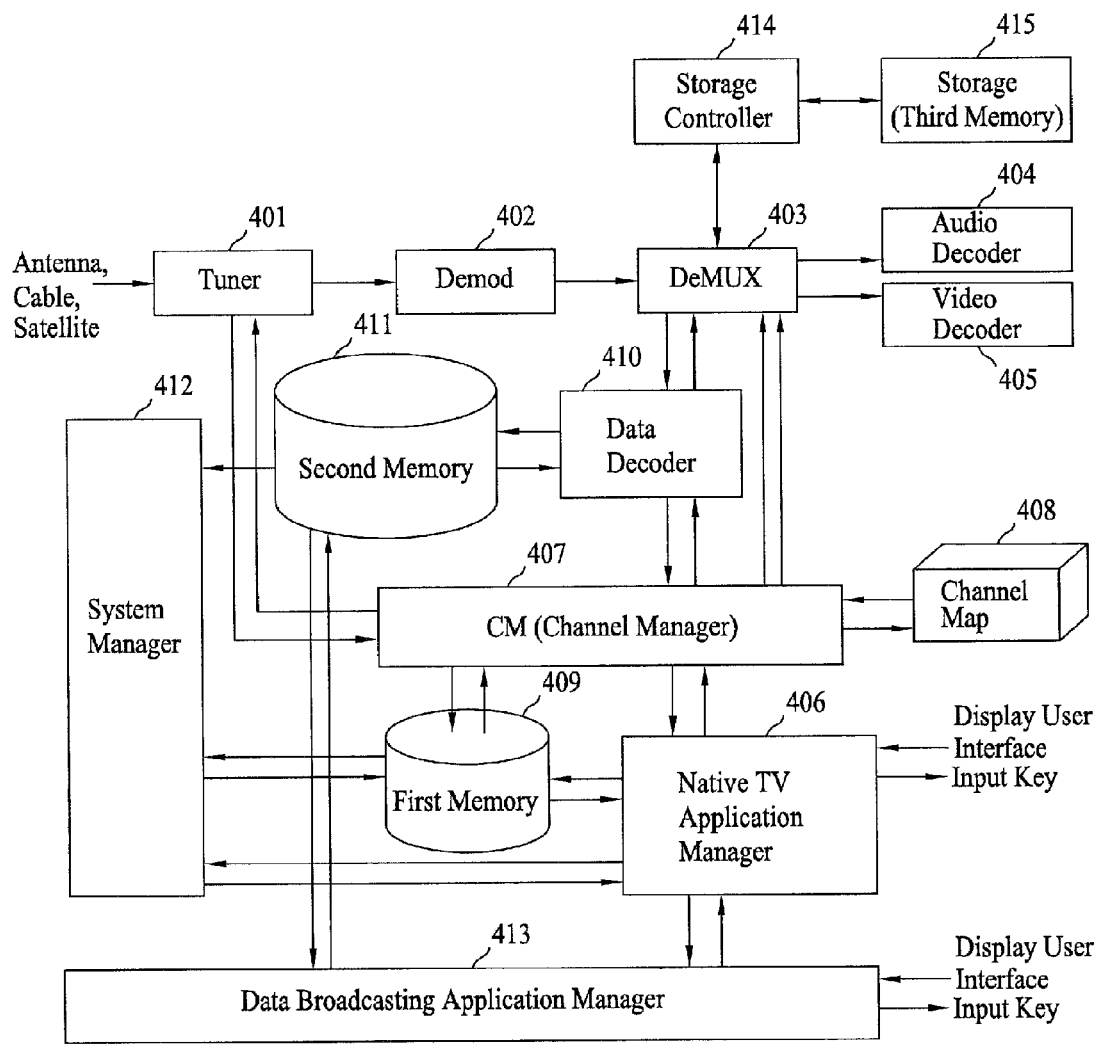
FIG. 4 illustrates a block diagram showing the structure of a digital broadcast (or DTV) receiver according to an embodiment of the present invention.

FIG. 4 illustrates a block diagram showing the structure of a digital broadcast receiver according to an embodiment of the present invention. Referring to FIG. 4, the digital broadcast receiver includes a tuner 401, a demodulating unit 402, a demultiplexer 403, an audio decoder 404, a video decoder 405, a native TV application manager 406, a channel manager 407, a channel map 408, a first memory 409, a data decoder 410, a second memory 411, a system manager 412, a data broadcasting application manager 413, a storage controller 414, and a third memory 415. Herein, the third memory 415 is a mass storage device, such as a hard disk drive (HDD) or a memory chip. The tuner 401 tunes a frequency of a specific channel through any one of an antenna, cable, and satellite. Then, the tuner 401 down-converts the tuned frequency to an intermediate frequency (IF), which is then outputted to the demodulating unit 402. At this point, the tuner 401 is controlled by the channel manager 407. Additionally, the result and strength of the broadcast signal of the tuned channel are also reported to the channel manager 407. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 402 performs VSB-demodulation and channel equalization on the signal being outputted from the tuner 401, thereby identifying the main data and the enhanced data. Thereafter, the identified main data and enhanced data are outputted in TS packet units. An example of the demodulating unit 402 is shown in FIG. 3. The demodulating unit shown in FIG. 3 is merely exemplary and the scope of the present invention is not limited to the example set forth herein. In the embodiment given as an example of the present invention, only the enhanced data packet outputted from the demodulating unit 402 is inputted to the demultiplexer 403. In this case, the main data packet is inputted to another demultiplexer (not shown) that processes main data packets. Herein, the storage controller 414 is also connected to the other demultiplexer in order to store the main data after processing the main data packets. The demultiplexer of the present invention may also be designed to process both enhanced data packets and main data packets in a single demultiplexer.

The storage controller 414 is interfaced with the demultipelxer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 4, the corresponding enhanced data and/or main data that are inputted to the demultiplexer are stored in the third memory 415 in accordance with the control of the storage controller 414. The third memory 415 may be described as a temporary storage area and/or a permanent storage area. Herein, the temporary storage area is used for the time shifting function, and the permanent storage area is used for a permanent storage of data according to the user's choice (or decision).

When the data stored in the third memory 415 need to be reproduced (or played), the storage controller 414 reads the corresponding data stored in the third memory 415 and outputs the read data to the corresponding demultiplexer (e.g., the enhanced data are outputted to the demultiplexer 403 shown in FIG. 4). At this point, according to the embodiment of the present invention, since the storage capacity of the third memory 415 is limited, the compression encoded enhanced data and/or main data that are being inputted are directly stored in the third memory 415 without any modification for the efficiency of the storage capacity. In this case, depending upon the reproduction (or reading) command, the data read from the third memory 415 pass trough the demultiplexer so as to be inputted to the corresponding decoder, thereby being restored to the initial state.

The storage controller 414 may control the reproduction (or play), fast-forward, rewind, slow motion, instant replay functions of the data that are already stored in the third memory 415 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 414 compression encodes the inputted data and stored the compression-encoded data to the third memory 415. In order to do so, the storage controller 414 may include an encoder, wherein the encoder may be embodied as one of software, middleware, and hardware. Herein, an MPEG encoder may be used as the encoder according to an embodiment of the present invention. The encoder may also be provided outside of the storage controller 414.

Meanwhile, in order to prevent illegal duplication (or copies) of the input data being stored in the third memory 415, the storage controller 414 scrambles the input data and stores the scrambled data in the third memory 415. Accordingly, the storage controller 414 may include a scramble algorithm for scrambling the data stored in the third memory 415 and a descramble algorithm for descrambling the data read from the third memory 415. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 403 receives the real-time data outputted from the demodulating unit 402 or the data read from the third memory 415 and demultiplexes the received data. In the example given in the present invention, the demultiplexer 403 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 403 and the subsequent elements.

The demultiplexer 403 demultiplexes enhanced data and program specific information/program and system information protocol (PSI/PSIP) tables from the enhanced data packet inputted in accordance with the control of the data decoder 410. Thereafter, the demultiplexed enhanced data and PSI/PSIP tables are outputted to the data decoder 410 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream type field included in the service location descriptor of the PMT or the VCT. More specifically, when the PMT or VCT stream type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 410, the demultiplexer 403 performs section filtering, thereby discarding repetitive sections and outputting only the non-repetitive sections to the data decoder 410. The demultiplexer 403 may also output only the sections configuring desired tables (e.g., VCT) to the data decoder 410 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 403 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PIP must be previously made between the transmitting system and the receiving system.

Meanwhile, in the embodiment of the present invention, the demultiplexer 403 may output only an application information table (AIT) to the data decoder 410 by section filtering. The AIT includes information on an application being operated in the receiver for the data service. The AIT may also be referred to as an XAIT, and an AMT. Therefore, any table including application information may correspond to the following description. When the AIT is transmitted, a value of '0x05' may be assigned to a stream type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 411 by the data decoder 410.

The data decoder 410 parses the DSM-CC section configuring the demultiplexed enhanced data. Then, the enhanced data corresponding to the parsed result are stored as a database in the second memory 411. The data decoder 410 groups a plurality of sections having the same table identification (table_id) so as to configure a table, which is then parsed. Thereafter, the parsed result is stored as a database in the second memory 411. At this point, by parsing data and/or sections, the data decoder 410 reads all of the remaining actual section data that are not section-filtered by the demultiplexer 403. Then, the data decoder 410 stores the read data to the second memory 411. The second memory 411 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 411 or be outputted to the data broadcasting application manager 413. In addition, reference may be made to the application identification information, service component identification information, and service information in order to decode the data service data. Alternatively, such information may also prepare the operation of the application program for the data service. Furthermore, the data decoder 410 controls the demultiplexing of the system information table, which corresponds to the information table associated with the channel and events. Thereafter, an A.V PID list may be transmitted to the channel manager 407.

The channel manager 407 may refer to the channel map 408 in order to transmit a request for receiving system-related information data to the data decoder 410, thereby receiving the corresponding result. In addition, the channel manager 407 may also control the channel tuning of the tuner 401. Furthermore, the channel manager 407 may directly control the demultiplexer 403, so as to set up the A/V PID, thereby controlling the audio decoder 404 and the video decoder 405. The audio decoder 404 and the video decoder 405 may respectively decode and output the audio data and video data demultiplexed from the main data packet. Alternatively, the audio decoder 404 and the video decoder 405 may respectively decode and output the audio data and video data demultiplexed from the enhanced data packet. Meanwhile, when the enhanced data include data service data, and also audio data and video data, it is apparent that the audio data and video data demultiplexed by the demultiplexer 403 are respectively decoded by the audio decoder 404 and the video decoder 405.

For example, an audio-coding (AC)-3 decoding algorithm may be applied to the audio decoder 404, and a MPEG-2 decoding algorithm may be applied to the video decoder 405.

Meanwhile, the native TV application manager 406 operates a native application program stored in the first memory 409, thereby performing general functions such as channel change. The native application program refers to software stored in the receiving system upon shipping of the product. More specifically, when a user request (or command) is transmitted to the receiving system through a user interface (UI), the native TV application manger 406 displays the user request on a screen through a graphic user interface (GUI), thereby responding to the user's request. The user interface receives the user request through an input device, such as a remote controller, a key pad, a jog controller, an a touchscreen provided on the screen, and then outputs the received user request to the native TV application manager 406 and the data broadcasting application manager 413. Furthermore, the native TV application manager 406 controls the channel manager 407, thereby controlling channel-associated, such as the management of the channel map 408, and controlling the data decoder 410. The native TV application manager 406 also controls the GUI of the overall receiving system, thereby storing the user request and status of the receiving system in the first memory 409 and restoring the stored information.

The channel manager 407 controls the tuner 401 and the data decoder 410, so as to managing the channel map 408 so that it can respond to the channel request made by the user. More specifically, channel manager 407 sends a request to the data decoder 410 so that the tables associated with the channels that are to be tuned are parsed. The results of the parsed tables are reported to the channel manager 407 by the data decoder 410. Thereafter, based on the parsed results, the channel manager 407 updates the channel map 408 and sets up a PID in the demultiplexer 403 for demultiplexing the tables associated with the data service data from the enhanced data.

The system manager 412 controls the booting of the receiving system by turning the power on or off. Then, the system manager 412 stores ROM images (including downloaded software images) in the first memory 409. More specifically, the first memory 409 stores management programs such as operating system (OS) programs required for managing the receiving system and also application program executing data service functions. The application program is a program processing the data service data stored in the second memory 411 so as to provide the user with the data service. If the data service data are stored in the second memory 411, the corresponding data service data are processed by the above-described application program or by other application programs, thereby being provided to the user. The management program and application program stored in the first memory 409 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 409 upon the shipping of the receiving system, or be stored in the first 409 after being downloaded. The application program for the data service (i.e., the data service providing application program) stored in the first memory 409 may also be deleted, updated, and corrected. Furthermore, the data service providing application program may be downloaded and executed along with the data service data each time the data service data are being received.

When a data service request is transmitted through the user interface, the data broadcasting application manager 413 operates the corresponding application program stored in the first memory 409 so as to process the requested data, thereby providing the user with the requested data service. And, in order to provide such data service, the data broadcasting application manager 413 supports the graphic user interface (GUI). Herein, the data service may be provided in the form of text (or short message service (SMS)), voice message, still image, and moving image. The data broadcasting application manager 413 may be provided with a platform for executing the application program stored in the first memory 409. The platform may be, for example, a Java virtual machine for executing the Java program. Hereinafter, an example of the data broadcasting application manager 413 executing the data service providing application program stored in the first memory 409, so as to process the data service data stored in the second memory 411, thereby providing the user with the corresponding data service will now be described in detail.

Assuming that the data service corresponds to a traffic information service, the data service according to the present invention is provided to the user of a receiver that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 4, the GPS module receives satellite signals transmitted from a plurality of low earth orbit satellites and extracts the current position (or location) information (e.g., longitude, latitude, altitude), thereby outputting the extracted information to the data broadcasting application manager 413.

At this point, it is assumed that the electronic map including information on each link and nod and other diverse graphic information are stored in one of the second memory 411, the first memory 409, and another memory that is not shown. More specifically, according to the request made by the data broadcasting application manager 413, the data service data stored in the second memory 411 are read and inputted to the data broadcasting application manager 413. The data broadcasting application manager 413 translates (or deciphers) the data service data read from the second memory 411, thereby extracting the necessary information according to the contents of the message and/or a control signal.

Figure 5:
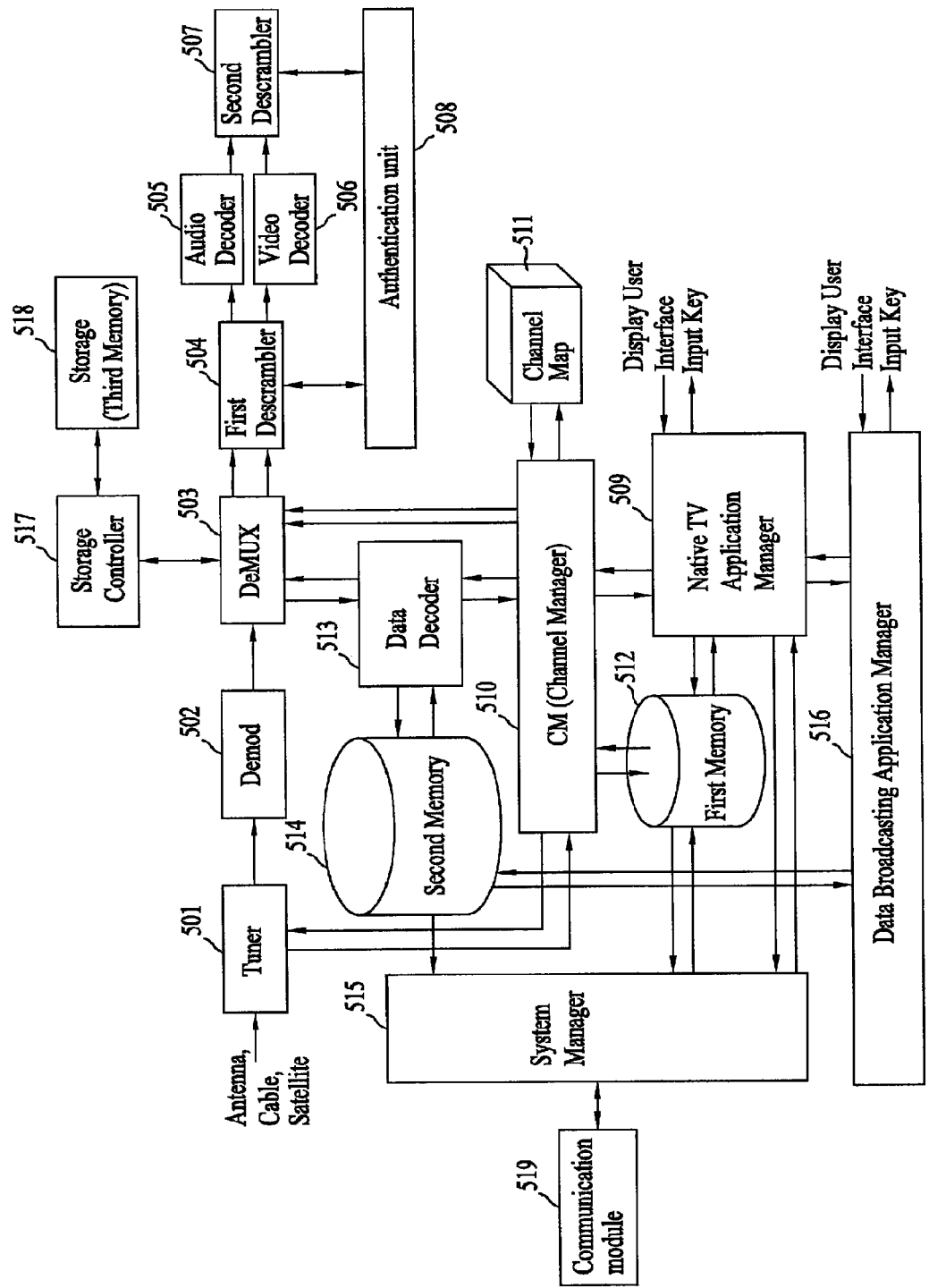
FIG. 5 illustrates a block diagram showing the structure of a digital broadcast (or DTV) receiver according to another embodiment of the present invention.

FIG. 5 illustrates a block diagram showing the structure of a digital broadcast (or television) receiver according to another embodiment of the present invention. Referring to FIG. 5, the digital broadcast receiver includes a tuner 501, a demodulating unit 502, a demultiplexer 503, a first descrambler 504, an audio decoder 505, a video decoder 506, a second descrambler 507, an authentication unit 508, a native TV application manager 509, a channel manager 510, a channel map 511, a first memory 512, a data decoder 513, a second memory 514, a system manager 515, a data broadcasting application manager 516, a storage controller 517, a third memory 518, and a telecommunication module 519. Herein, the third memory 518 is a mass storage device, such as a hard disk drive (HDD) or a memory chip. Also, during the description of the digital broadcast (or television) receiver shown in FIG. 5, the components that are identical to those of the digital broadcast receiver of FIG. 4 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating for verifying) whether the receiving system is entitled to receive the descrambled contents. Hereinafter, the descrambling means will be referred to as first and second descramblers 504 and 507, and the authentication means will be referred to as an authentication unit 50B. Such naming of the corresponding components is merely exemplary and is not limited to the terms suggested in the description of the present invention. For example, the units may also be referred to as a decryptor. Although FIG. 5 illustrates an example of the descramblers 504 and 507 and the authentication unit 508 being provided inside the receiving system, each of the descramblers 504 and 507 and the authentication unit 508 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 508, the scrambled broadcasting contents are descrambled by the descramblers 504 and 507, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 508 and the descramblers 504 and 507 will now be described in detail. The receiving system receives the scrambled broadcasting contents through the tuner 501 and the demodulating unit 502. Then, the system manager 515 decides whether the received broadcasting contents have been scrambled. Herein, the demodulating unit 502 may be included as a demodulating means according to an embodiment of the present invention as described in FIG. 3. However, the present invention is not limited to the examples given in the description set forth herein. If the system manager 515 decides that the received broadcasting contents have been scrambled, then the system manager 515 controls the system to operate the authentication unit 508. As described above, the authentication unit 50B performs an authentication process in order to decide whether the receiving system according to the present invention corresponds to a legitimate host entitled to receive the paid broadcasting service. Herein, the authentication process may vary in accordance with the authentication methods.

For example, the authentication unit 508 may perform the authentication process by comparing an IP address of an IP datagram within the received broadcasting contents with a specific address of a corresponding host. At this point, the specific address of the corresponding receiving system (or host) may be a MAC address. More specifically, the authentication unit 508 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 508 performs the authentication process by determining the conformity between the address of the corresponding receiving system and the system information of the receiving system that is mapped with the IP address. In other words, if the authentication unit 508 determines that the two types of information conform to one another, then the authentication unit 508 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or another data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiver-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 508 of the receiving system extracts the identification information of the receiving system and the identification information included in the EMM of the broadcasting service that is being received. Then, the authentication unit 508 determines whether the identification information conform to each other, so as to perform the authentication process. More specifically, if the authentication unit 508 determines that the information conform to each other, then the authentication unit 508 eventually determines that the receiving system is entitled to receive the request broadcasting service.

In yet another example, the authentication unit 508 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 515 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 515 transmits the payment information to the remote transmitting system through the telecommunication module 519.

The authentication unit 508 authenticates the corresponding receiving system and/or the external module. Then, if the authentication process is successfully completed, the authentication unit 508 certifies the corresponding receiving system and/or the external module as a legitimate system and/or module entitled to receive the requested paid broadcasting service. In addition, the authentication unit 508 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 508, the receiving system may descramble the scrambled broadcasting contents received from the transmitting system. At this point, the descrambling process is performed by the first and second descramblers 504 and 507. Herein, the first and second descramblers 504 and 507 may be included in an internal module or an external module of the receiving system.

The receiving system is also provided with a common interface for communicating with the external module including the first and second descramblers 504 and 507, so as to perform the descrambling process. More specifically, the first and second descramblers 504 and 507 may be included in the module or in the receiving system in the form of hardware, middleware or software. Herein, the descramblers 504 and 507 may be included in any one of or both of the module and the receiving system. If the first and second descramblers 504 and 507 are provided inside the receiving system, it is advantageous to have the transmitting system (i.e., at least any one of a service provider and a broadcast station) scramble the corresponding data using the same scrambling method.

Alternatively, if the first and second descramblers 504 and 507 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 515, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 512 of the receiving system. Thereafter, the CAS software is operated in the receiving system as an application program. According to an embodiment of the present invention, the CAS software is mounted on (or stored) in a middleware platform and, then, executed. A Java middleware will be given as an example of the middleware included in the present invention. Herein, the CAS software should at least include information required for the authentication process and also information required for the descrambling process.

Therefore, the authentication unit 508 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 508 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 515, then the memory card is verified and determined to be a normal memory card that may be used in the receiving system. At this point, the CAS software may either be installed in the first memory 512 upon the shipping of the present invention, or be downloaded to the first memory 512 from the transmitting system or the module or memory card, as described above. Herein, the descrambling function may be operated by the data broadcasting application manger 516 as an application program.

Thereafter, the CAS software parses the EMM/ECM packets outputted from the demultiplexer 503, so as to verify whether the receiving system is entitled to receive the corresponding data, thereby obtaining the information required for descrambling (i.e., the CW) and providing the obtained CW to the descramblers 504 and 507. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 504 and 507. Each of the descramblers 504 and 507 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiver, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 504 and 507 may be included in the module either in the form of hardware or in the form of software. In this case, the scrambled data that being received are descrambled by the module and then demodulated. Also, if the scrambled data that are being received are stored in the third memory 518, the received data may be descrambled and then stored, or stored in the memory at the point of being received and then descrambled later on prior to being played (or reproduced). Thereafter, in case scramble/descramble algorithms are provided in the storage controller 517, the storage controller 517 scrambles the data that are being received once again and then stores the re-scrambled data to the third memory 518.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 519. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 519 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 519 may also be configured. Also, the PDU may be configured in the Java application of the receiving system and then outputted to the telecommunication module 519. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1×EV-DO, which can be connected through a mobile telecommunication base station, such as CDMA and GSM, and also provided with a wireless LAN, mobile Internet, WiBro, WiMax, which can be connected through an access point. The above-described receiving system corresponds to the system that is not equipped with a telecommunication function. However, a receiving system equipped with telecommunication function does not require the telecommunication module 519.

The broadcasting data being transmitted and received through the above-described wireless data network may include data required for performing the function of limiting data reception. Meanwhile, the demultiplexer 503 receives either the real-time data outputted from the demodulating unit 502 or the data read from the third memory 518, thereby performing demultiplexing. In this embodiment of the present invention, the demultiplexer 503 performs demultiplexing on the enhanced data packet. Similar process steps have already been described earlier in the description of the present invention. Therefore, a detailed of the process of demultiplexing the enhanced data will be omitted for simplicity.

The first descrambler 504 receives the demultiplexed signals from the demultiplexer 503 and then descrambles the received signals. At this point, the first descrambler 504 may receive the authentication result received from the authentication unit 508 and other data required for the descrambling process, so as to perform the descrambling process. The audio decoder 505 and the video decoder 506 receive the signals descrambled by the first descrambler 504, which are then decoded and outputted. Alternatively, if the first descrambler 504 did not perform the descrambling process, then the audio decoder 505 and the video decoder 506 directly decode and output the received signals. In this case, the decoded signals are received and then descrambled by the second descrambler 507 and processed accordingly.

As described above, the DTV receiver and method of processing data according to the present invention has the following advantages. More specifically, the DTV receiver and method of processing data according to the present invention is highly protected against (or resistant to) any error that may occur when transmitting supplemental data through a channel. And, the present invention is also highly compatible to the conventional VSB receiving system. Moreover, the present invention may also receive the supplemental data without any error even in channels having severe ghost effect and noise.

Additionally, by inserting known data in a specific place (or position) of the data domain and transmitting the processed data, the receiving performance of the digital broadcast (or digital television) receiver liable to a frequent change in channel may be enhanced. The present invention is even more effective when applied to mobile and portable receivers, which are also liable to a frequent change in channel and which require robustness against intense noise. Finally, by performing a soft decision on the enhanced data and outputting the processed data from the SISO decoder of the receiving system, the present invention may enhanced the performance of the additional error correction decoding process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital television (DTV) transmitter comprising:
a first encoder for convolutional encoding enhanced data at a coding rate of 1/N, wherein N is greater than 1;
a deinterleaver for deinterleaving the convolutional encoded enhanced data;
a second encoder for Reed Solomon (RS) encoding the deinterleaved enhanced data by adding first parity data to the deinterleaved enhanced data;
an interleaver for interleaving the RS-encoded enhanced data;
a third encoder for trellis encoding the interleaved enhanced data and known data sequences, wherein at least one memory in the third encoder is initialized by initialization data at a start of each known data sequence;
a compatible processor for calculating second parity data based on the initialization data, replacing corresponding first parity data with the second parity data and outputting the replaced second parity data to the third encoder;
a multiplexer for multiplexing the trellis encoded data with segment synchronization data and field synchronization data; and
a modulator for modulating a broadcast signal including the multiplexed data.

2. The DTV transmitter of claim 1, further comprising:
a converter for converting symbols of the convolutional encoded enhanced data into bytes of the convolutional encoded enhanced data.

3. The DTV transmitter of claim 1, wherein the initialization data is determined based on a value of the at least one memory.

4. The DTV transmitter of claim 1, wherein the broadcast signal further includes main data, wherein a convolutional encoding process is not performed on the main data.

5. A method of processing broadcast data in a digital television (DTV) transmitter, the method comprising:
convolutional encoding, by a first encoder, enhanced data at a coding rate of 1/N, wherein N is greater than 1;
deinterleaving, by a deinterleaver, the convolutional encoded enhanced data;
Reed Solomon (RS) encoding, by a second encoder, the deinterleaved enhanced data by adding first parity data to the deinterleaved enhanced data;
interleaving, by an interleaver, the RS-encoded enhanced data;
trellis encoding, by a third encoder, the interleaved enhanced data and known data sequences, wherein at least one memory in the third encoder is initialized by initialization data at a start of each known data sequence;
calculating second parity data based on the initialization data, replacing corresponding first parity data with the second parity data and outputting the replaced second parity data to the third encoder;
multiplexing the trellis encoded data with segment synchronization data and field synchronization data; and
modulating a broadcast signal including the multiplexed data.

6. The method of claim 5, further comprising:
converting symbols of the convolutional encoded enhanced data into bytes of the convolutional encoded enhanced data.

7. The method of claim 5, wherein the initialization data is determined based on a value of the at least one memory.

8. The method of claim 5, wherein the broadcast signal further includes main data, wherein a convolutional encoding process is not performed on the main data.

* * * * *